United States Patent
Heikkilä

(10) Patent No.: US 7,250,739 B2
(45) Date of Patent: Jul. 31, 2007

(54) METHOD FOR ESTIMATING THE ROTOR TIME CONSTANT OF AN INDUCTION MACHINE

(75) Inventor: Samuli Heikkilä, Helsinki (FI)

(73) Assignee: ABB Oy, Helsinki (FI)

( * ) Notice: Subject to any disclaimer, the term of this patent is extended or adjusted under 35 U.S.C. 154(b) by 0 days.

(21) Appl. No.: 11/444,296

(22) Filed: Jun. 1, 2006

(65) Prior Publication Data

US 2006/0273755 A1 Dec. 7, 2006

(30) Foreign Application Priority Data

Jun. 2, 2005 (EP) ................................. 05104798

(51) Int. Cl.
G01R 31/34 (2006.01)

(52) U.S. Cl. ..................................... 318/727

(58) Field of Classification Search ................ 318/727; 324/602, 618
See application file for complete search history.

(56) References Cited

U.S. PATENT DOCUMENTS

| | | | | |
|---|---|---|---|---|
| 5,371,458 A | * | 12/1994 | Heikkila ..................... | 324/772 |
| 5,444,351 A | * | 8/1995 | Yamamura et al. .......... | 318/811 |
| 5,476,158 A | * | 12/1995 | Mann et al. ................. | 187/289 |
| 5,594,670 A | * | 1/1997 | Yamamoto ................... | 702/64 |
| 5,883,344 A | * | 3/1999 | Colby et al. ................. | 187/393 |
| 5,896,954 A | * | 4/1999 | Colby et al. ................. | 187/391 |
| 5,909,018 A | * | 6/1999 | Vecchiotti et al. ........... | 187/393 |
| 5,929,400 A | | 7/1999 | Colby et al. | |
| 2002/0158658 A1 | | 10/2002 | Godbersen | |
| 2003/0155885 A1 | | 8/2003 | Zaremba et al. | |

OTHER PUBLICATIONS

Abdellfattah Ba-Razzouk, Implementation of a DSP Based Real Time Estimator of Induction Motors Rotor Time Constant, IEEE Transactions on Power Electronics, vol. 17, No. 4, Jul. 4, 2002, pp. 534-542, XP-002344348.

M.A.A. Freitas et al., A Novel Rotor Flux Estimator for Vector-Controlled Induction Motor Drives, The 29th Annual Conference of the IEEE Industrial Electronics Society, vol. 1, Nov. 2003, pp. 156-161, XP-002344349.

* cited by examiner

*Primary Examiner*—Bentsu Ro
(74) *Attorney, Agent, or Firm*—Buchanan Ingersoll & Rooney PC

(57) ABSTRACT

A method for estimating the rotor time constant ($\tau_r$) of an induction machine when the stator resistance ($R_s$) and rotor resistance ($R_r$) of the induction machine are known. The method comprises the steps of feeding a DC current to the stator of the induction machine, injecting a sine-wave current component into the stator of the induction machine, the current having an amplitude ($i_{sc}$) and an angular frequency ($\omega_c$), measuring the voltage component ($u_{scd}$) of the stator voltage of the induction machine in the same direction and with the same angular frequency as the injected current, and calculating the rotor time constant using equation $$\tau_r = \frac{1}{\omega_c}\sqrt{\frac{u_{scd} - R_s i_{sc}}{(R_s + R_R)i_{sc} - u_{scd}}}.$$

2 Claims, 1 Drawing Sheet

METHOD FOR ESTIMATING THE ROTOR TIME CONSTANT OF AN INDUCTION MACHINE

RELATED APPLICATION

The present application claims priority under 35 USC § 119 to European Patent Application No. 05104798.3, filed Jun. 2, 2005, the contents of which are hereby incorporated by reference in their entirety.

BACKGROUND OF THE INVENTION

The invention relates to a method for estimating the rotor time constant of an induction machine. More specifically, the invention relates to a method which can be used to estimate the rotor time constant during the DC magnetization period of the induction machine prior to the controlled use of the machine.

In a plurality of control methods, the essential parameters of the induction machine are needed for reliable and accurate control of the machine. These parameters include stator and rotor resistances $R_s$, $R_R$ and main and stray inductances $L_M$, $\sigma L_s$. The rotor time constant $\tau_r$ is the ratio between the main inductance and the rotor resistance $\tau_r = L_M/R_R$. Thus by estimating the rotor time constant one can calculate the main inductance if the rotor resistance is known.

There are multiple methods for carrying out the estimation of the mentioned parameters. One of these methods is disclosed in U.S. Pat. No. 5,929,400, in which the estimation is based on current injection. The estimation of rotor time constant requires an accurate estimate of stray inductance, which makes the estimation in U.S. Pat. No. 5,929,400 prone to errors. The estimation of the stray inductance always includes considerable uncertainty, because eddy currents and saturation effects cause unknown errors to the calculation.

BRIEF DESCRIPTION OF THE INVENTION

It is an object of the present invention to provide an alternative method that avoids the above-mentioned drawbacks and enables accurate estimation of rotor time constant. This object is achieved by a method of the invention that is characterized by what is stated in independent claim 1.

The invention is based on the idea that during DC magnetization a sine-wave current is injected into the stator. The induced voltage is measured in the direction of the injected current and the rotor time constant is calculated based on the induced voltage component.

The method of the invention provides a simple and accurate estimation method for estimating the rotor time constant. The estimation requires only estimates of stator and rotor resistances and no other measurements. Since the stator and rotor resistances can be estimated accurately, the method of the invention provides an accurate estimate for the rotor time constant. This time constant can be further used to calculate the main inductance of the induction machine.

BRIEF DESCRIPTION OF THE FIGURES

The invention will now be described in more detail by means of preferred embodiments and with reference to the attached drawings, in which.

DETAILED DESCRIPTION OF THE INVENTION

Figure 1:
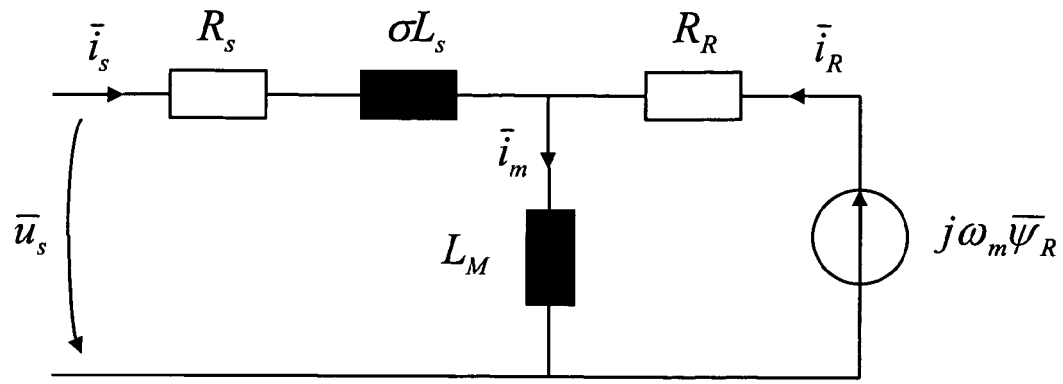
FIG. 1 shows an L-type equivalent model of an induction machine.

In FIG. 1, a simple equivalent circuit of an induction machine is shown. The symbols used in FIG. 1 are as follows: $\bar{u}_s$ is a stator voltage vector, $\bar{i}_s$ is a stator current vector, $i_R$ is a rotor current vector, $R_s$ is stator resistance, $R_R$ is rotor resistance, $\sigma L_s$ is stray inductance, $L_M$ is main inductance and $j\omega_m \bar{\psi}_R$ is a counter voltage dependent on the rotor flux vector $\bar{\psi}_R$ and angular speed of the machine $\omega_m$.

The method of the invention is used during DC magnetization of the induction machine, and thus the machine is not running. As a starting point for the method, the stator and rotor resistances are known. In the method of the invention, a DC current is fed to the stator of the induction machine and a sine-wave current is added to the stator current. The stator current is then $$i_s = i_{s0} + i_{sc}\cos(\omega_c t),$$

where $i_{s0}$ is the average of the stator current, $i_{sc}$ is the amplitude of the injected alternating current, $\omega_c$ is the angular frequency of the injected current.

The magnitude of the DC current is preferably the assumed magnetizing current of the machine. When the current component having an amplitude of $i_{sc}$ and angular frequency of $\omega_c$ is considered as a vector rotating in a complex plane, the equation (1) can be written as:

$$i_s = i_{s0} + \mathrm{Re}\{i_{sc} e^{j\omega_c t}\}$$

Due to the current injection, the stator voltage and the rotor flux achieve corresponding injection-frequency components $u_{sc}$ and $\omega_{Rc}$. In a normal situation, they are not in the same phase with the current injection, thus both active $u_{scd}$, $\omega_{Rcd}$ and reactive $u_{scq}$, $\psi_{Rcq}$ components are formed in them:

$$\begin{cases} u_s = u_{s0} + \mathrm{Re}\{(u_{scd} + ju_{scq})e^{j\omega_c t}\} \\ \psi_R = \psi_{R0} + \mathrm{Re}\{(\psi_{Rcd} + j\psi_{Rcq})e^{j\omega_c t}\} \end{cases}$$

By inserting equations (2) and (3) to the equation of dynamic state $$u_s = (R_s + R_R)i_s + \sigma L_s \frac{di_s}{dt} - \frac{\psi_R}{\tau_r}$$

the following steady state equations are achieved for DC and injection frequency components:

$$\begin{cases} u_{s0} = (R_s + R_R)i_{s0} - \frac{\psi_{R0}}{\tau_r} = (R_s + R_R)i_{s0} - R_R \frac{\psi_{R0}}{L_M} = R_s i_{s0} \\ u_{scd} + ju_{scq} = (R_s + R_R)i_{sc} + j\sigma L_s \omega_c i_{sc} - \frac{1}{\tau_r}(\psi_{Rcd} + j\psi_{Rcq}) \end{cases}$$

According to the previous equation, the DC components of voltage and current are related to each other by Ohm's law.

From the latter equation, one achieves d and q components of the injection frequency voltage:

$$\begin{cases} u_{scd} = (R_s + R_R)i_{sc} - \dfrac{\psi_{Rcd}}{\tau_r} \\ u_{scq} = \sigma L_s \omega_c i_{sc} - \dfrac{\psi_{Rcq}}{\tau_r} \end{cases}$$

The injection frequency components $\psi_{Rcd}$ and $\psi_{Rcq}$ of equation (5) can be determined from the rotor flux estimated using a voltage model:

$$\psi_R = \psi_s - \sigma L_s i_s = \int (u_s - R_s i_s) dt - \sigma L_s i_s$$

$$\Rightarrow \begin{cases} \psi_{Rcd} = \dfrac{u_{scq}}{\omega_c} - \sigma L_s i_{sc} \\ \psi_{Rcq} = -\dfrac{1}{\omega_c}(u_{scd} - R_s i_{sc}) \end{cases}$$

When inserting equation (6) to equation (5):

$$\begin{cases} u_{scd} = (R_s + R_R)i_{sc} - \dfrac{u_{scq} - \sigma L_s \omega_c i_{sc}}{\omega_c \tau_r} \\ u_{scq} = \sigma L_s \omega_c i_{sc} + \dfrac{u_{scd} - R_s i_{sc}}{\omega_c \tau_r} \end{cases}$$

The rotor time constant could be solved from each of the above equations if, in addition to the resistances, the stray inductance were known accurately enough. Then from the upper equation we get:

$$\tau_r = \dfrac{u_{scq} - \sigma L_s \omega_c i_{sc}}{\omega_c((R_s + R_R)i_{sc} - u_{scd})}$$

And correspondingly from the lower equation:

$$\tau_r = \dfrac{u_{scd} - R_s i_{sc}}{\omega_c(u_{scq} - \sigma L_s \omega_c i_{sc})}$$

The problem, however, is the stray inductance present in the equations. The accuracy of the stray inductance affects greatly the rotor time constant achieved from the equations.

It is thus wise to eliminate the q-directional voltage component $u_{scq} - \sigma L_s \omega_c i_{sc}$, which holds the stray inductance term, from equation 7.

$$\tau_r = \dfrac{1}{\omega_c} \sqrt{\dfrac{u_{scd} - R_s i_{sc}}{(R_s + R_R)i_{sc} - u_{scd}}}$$

According to the invention, the stator voltage component that has the same direction and angular frequency as the injected current is measured. The measurement can be carried out in a normal manner known in the art.

In the method of the present invention, the only measured quantity is thus the d-directional voltage component $u_{scd}$ at the injection frequency, when the stator and rotor resistances are known. In the method of the invention, the rotor time constant is thus calculated using equation (10).

The injection frequency should be selected such that the best possible accuracy is gained. That means that both the nominator and the denominator of the square-root expression in equation (10) should be as large as possible. By solving $u_{scd}$ from equation (7) we get $$u_{scd} = \dfrac{R_s i_{sc} + (\omega_c \tau_r)^2 (R_s + R_R) i_{sc}}{1 + (\omega_c \tau_r)^2},$$

so the nominator of the square-root expression of equation (10) is $$u_{scd} - R_s i_{sc} = \dfrac{R_s i_{sc} + (\omega_c \tau_r)^2 (R_s + R_R) i_{sc}}{1 + (\omega_c \tau_r)^2} - R_s i_{sc} = \dfrac{(\omega_c \tau_r)^2 R_R i_{sc}}{1 + (\omega_c \tau_r)^2}$$

Correspondingly the denominator is $$(R_s + R_R)i_{sc} - u_{scd} = (R_s + R_R)i_{sc} - \dfrac{R_s i_{sc} + (\omega_c \tau_r)^2 (R_s + R_R)i_{sc}}{1 + (\omega_c \tau_r)^2}$$

$$= \dfrac{R_R i_{sc}}{1 + (\omega_c \tau_r)^2}$$

The nominator is thus a monotonically growing function with respect to the injection frequency, whereas the denominator is a descending function. This means that with respect to the estimation accuracy it is best to choose $\omega_c$ so that the nominator and the denominator are substantially equal, i.e.

$$\omega_c = \dfrac{1}{\tau_r}$$

During the injection, the estimate for the rotor time constant is not yet available with the method of the invention, so one has to use the value $\tau_e$ achieved from the induction machine's manufacturer. The accuracy of the given value is, however, suitable for choosing the injection frequency as described above.

In choosing the amplitude of the injected current, it should be noted that due to the saturation of the main inductance its value and thus the value of the rotor time constant is dependent on the magnitude of the rotor flux. The amplitude of the injected current should be chosen small enough so that the rotor flux does not change considerably during one injection period. According to the simulations carried out, a reliable estimate for the rotor time constant is achieved with the present method even when the current amplitude is only 2% of the nominal current.

If the change in the stator resistance due to the warming up of the machine is considerable during the current injection, it can be easily compensated by updating the value of stator resistance based on the DC components of the voltage and current, since in the steady state the following equation holds:

$$R_s = \frac{u_{s0}}{i_{s0}}$$

When the rotor time constant is achieved with the method of the invention, the main inductance can be calculated directly with the equation:

$$L_M = R_R \tau_r$$

Figure 2:
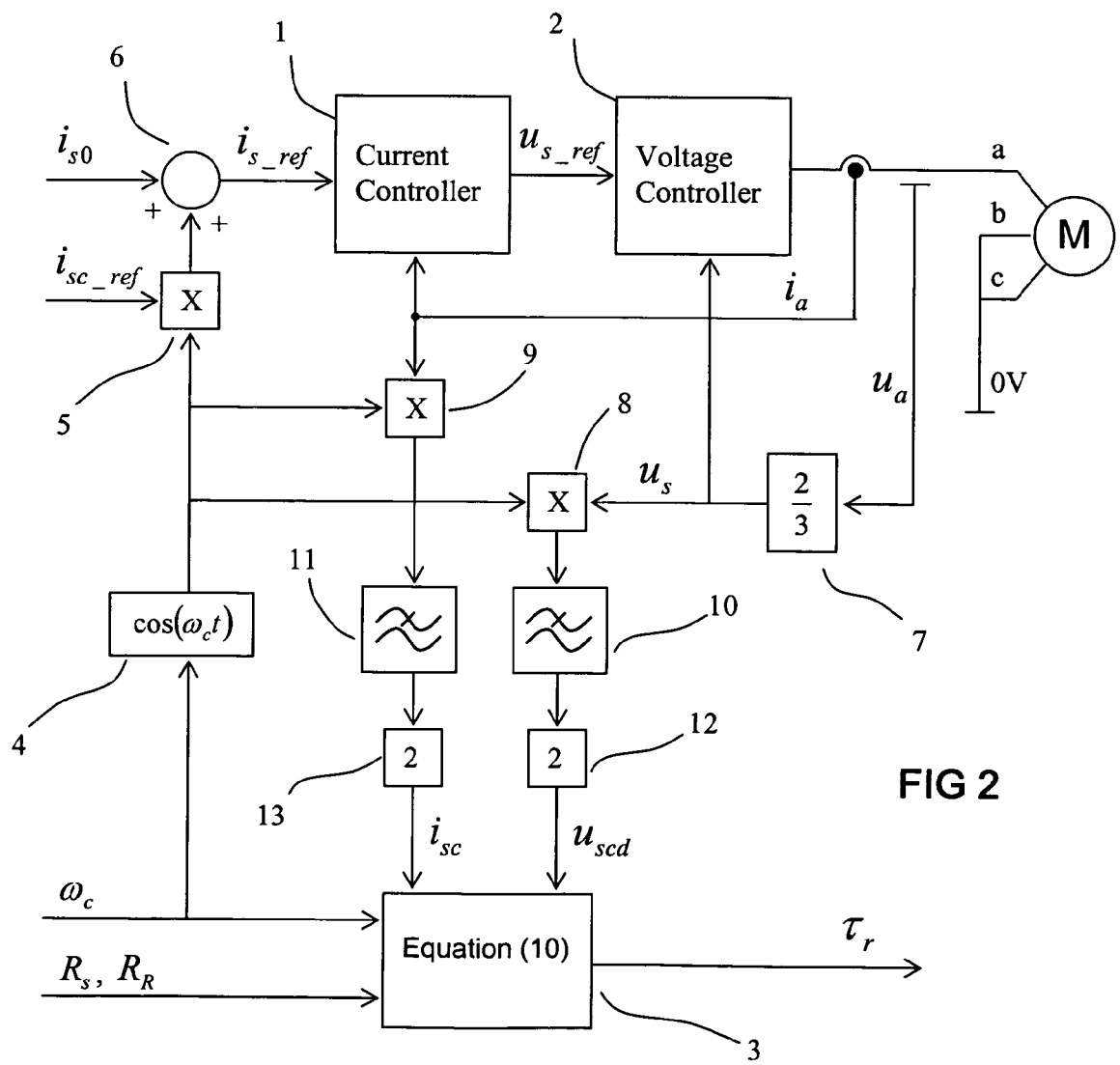
FIG. 2 shows a simplified block diagram illustrating the method of the invention.

FIG. 2 is a block diagram showing the operation of the method of the invention. FIG. 2 shows a current controller 1 and voltage controller 2. These controllers are typically the controllers of a frequency converter, which are used during normal operation of the converter to control the induction machine as required. In FIG. 2, for the sake of simplicity, only the machine M phase a is connected to the converter output and machine phases b and c are connected to 0V potential. The actual arrangement does not need such connections, since the other two phases can be connected to minus potential of the intermediate voltage circuit of the frequency converter, for example. In the example of FIG. 2 the sine-wave injection is carried out in the direction of phase a. The actual injection does not necessarily have to be carried out in the exact direction of a certain phase when all the output phases are in active use.

In FIG. 2, first the angular frequency $\omega_c$ of the injected sine-wave is inputted to the system together with the values of the stator and the rotor resistances $R_s$, $R_R$. These values are fed straight to a block which implements equation (10) for calculating the rotor time constant $\tau_r$. For the calculation of $\tau_r$, also current $i_{sc}$ and voltage $u_{scd}$ are needed, and these values are provided from the control system as will be described below.

The angular frequency of the injected sine-wave is used with a $\cos(\omega_c t)$ block 4 to form a sine-wave signal. This signal is further multiplied by the reference amplitude of the injected current $i_{sc\_ref}$ in multiplication block 5. The result of this multiplication is added to the DC component of the stator current $i_{s0}$ in summation block 6 to produce a reference current $i_{s\_ref}$, which is fed to the current controller 1. The current controller produces a voltage reference $u_{s\_ref}$ to the voltage controller, which produces output voltages to machine phases, and in this example only to machine phase a.

The current of the machine phase a is measured and the measured current $i_a$ is fed back to the current controller 1. Also the voltage of the machine phase a is measured and this measured voltage $u_a$ is multiplied by ⅔ in multiplication block 7. This multiplication is carried out in order to change the voltage from three-phase abc-system to a two-phase dq-coordination system. The general form for the coordination change is $$u_s = \frac{2}{3}\left(u_a + u_b e^{j2\frac{\pi}{3}} + u_c e^{j4\frac{\pi}{3}}\right),$$

which in the present case simplifies to form $$u_s = \frac{2}{3}u_a,$$

since $u_b = u_c = 0$. The stator voltage $u_s$ is again fed back to the voltage controller 2.

At this point, the stator voltage $u_s$ and current $i_a$ are derived from the system. In equation 10, only the injection frequency components in the direction of the injection are needed. The elimination of the other components from the current and voltage is carried out by first multiplying the stator voltage $u_s$ and current $i_a$ by the term $\cos(\omega_c t)$ in blocks 8 and 9, respectively. The outcome from these blocks $u_s \cos(\omega_c t)$ and $i_a \cos(\omega_c t)$ are further led to low-pass filter blocks 10 and 11.

The low-pass filtering of $u_s \cos(\omega_c t)$ produces $$\frac{u_{scd}}{2}$$

since from equation (3):

$$u_s = u_{s0} + u_{scd}\cos(\omega_c t) - u_{scq}\sin(\omega_c t) \Rightarrow LPF\{u_s\cos(\omega_c t)\}$$

$$= \frac{\omega_c}{2\pi}\int_0^{2\pi/\omega_c} u_s\cos(\omega_c t)dt$$

$$= \frac{u_{scd}}{2}$$

Correspondingly the low-pass filtering of $i_a \cos(\omega_c t)$ produces $$\frac{i_{sc}}{2}.$$

Thus these low-pass filtered values have to be multiplied by 2 (blocks 12 and 13) to get the required current $i_{sc}$ and voltage $u_{scd}$ to be used in equation (10) in block 3. As mentioned earlier, block 3 implements equation (10) and provides value of rotor time constant $\tau_r$. If the current controller is fast and accurate, the current does not have be measured, and the current reference $i_{sc\_ref}$ can be used in the place of the determined current $i_{sc}$. This modification eliminates the blocks 9, 11 and 13 from the block diagram of FIG. 2.

The block diagram of FIG. 2 is merely an embodiment that can be used to carry out the method of the invention. It is, however, clear that the diagram of FIG. 2 is not the only possible way of carrying out the method of the invention.

The above method is preferably carried out in a frequency converter, which is connected to the induction machine in order to control the machine. A frequency converter can readily provide the currents required by the method for the machine and the required voltage measurement is also easy to accomplish using the normal measurement facilities of the converter. Further, modern frequency converters have a vast amount of calculation capacity so that the calculation of the rotor time constant can also be carried out in the converter.

It is obvious to a person skilled in the art that while technology advances, the basic idea of the invention can be implemented in many different ways. The invention and its embodiments are thus not restricted to the examples described above, but can vary within the scope of the claims.

The invention claimed is:

1. A method for estimating the rotor time constant ($\tau_r$) of an induction machine when the stator resistance ($R_s$) and rotor resistance ($R_r$) of the induction machine are known, the method comprising:

feeding a DC current to the stator of the induction machine, injecting a sine-wave current component into the stator of the induction machine, the current having an amplitude ($i_{sc}$) and an angular frequency ($\omega_c$), measuring the voltage component ($u_{scd}$) of the stator voltage of the induction machine in the same direction and with the same angular frequency as the injected current, and calculating the rotor time constant using equation $$\tau_r = \frac{1}{\omega_c} \sqrt{\frac{u_{scd} - R_s i_{sc}}{(R_s + R_R)i_{sc} - u_{scd}}}.$$

2. A method according to claim 1, wherein the frequency of the injected sine-wave current is selected to be $1/\tau_e$, where $\tau_e$ is an estimate for the rotor time constant.